United States Patent
Reddy et al.

(10) Patent No.: US 8,082,381 B2
(45) Date of Patent: Dec. 20, 2011

(54) CONNECTING A PLURALITY OF PERIPHERALS

(75) Inventors: Sreenivas Reddy, Hyderabad (IN);
Vikas Bansal, Ghaziabad (IN); Kiran Kumar Kathireddy, Hyderabad (IN)

(73) Assignee: NVIDIA Corporation, Santa Clara, CA (US)

( * ) Notice: Subject to any disclaimer, the term of this patent is extended or adjusted under 35 U.S.C. 154(b) by 205 days.

(21) Appl. No.: 12/202,444

(22) Filed: Sep. 2, 2008

(65) Prior Publication Data
US 2010/0057974 A1 Mar. 4, 2010

(51) Int. Cl.
*G06F 13/00* (2006.01)

(52) U.S. Cl. ........ 710/316; 710/317; 370/351; 370/357; 370/363; 370/387; 370/388; 370/395.31; 370/541

(58) Field of Classification Search .................. 710/305, 710/316, 317, 5, 31, 40, 51, 52, 66; 370/351, 370/357, 360, 362, 363, 387, 388, 395.31, 370/395.32, 539–541
See application file for complete search history.

(56) References Cited

U.S. PATENT DOCUMENTS

| | | | |
|---|---|---|---|
| 4,000,487 A * | 12/1976 | Patterson et al. | 710/40 |
| 4,100,601 A * | 7/1978 | Kaufman et al. | 710/32 |
| 4,553,224 A * | 11/1985 | Struger et al. | 710/5 |
| 4,628,446 A * | 12/1986 | Hoffner, II | 710/66 |
| 5,293,489 A * | 3/1994 | Furui et al. | 710/317 |
| 5,347,637 A * | 9/1994 | Halford | 710/316 |
| 5,508,909 A | 4/1996 | Maxwell et al. | |
| 5,819,058 A | 10/1998 | Miller et al. | |
| 6,233,641 B1 * | 5/2001 | Graham et al. | 710/316 |
| 6,381,664 B1 * | 4/2002 | Nishtala et al. | 710/305 |
| 6,499,077 B1 | 12/2002 | Abramson et al. | |
| 6,553,446 B1 * | 4/2003 | Miller | 710/307 |
| 6,658,559 B1 | 12/2003 | Arora et al. | |
| 6,678,784 B2 * | 1/2004 | Marmash | 710/316 |
| 6,715,023 B1 * | 3/2004 | Abu-Lebdeh et al. | 710/317 |
| 6,721,813 B2 | 4/2004 | Owen et al. | |
| 6,732,210 B1 | 5/2004 | Mathieson | |
| 6,847,365 B1 | 1/2005 | Miller et al. | |
| 7,332,929 B1 | 2/2008 | Normoyle et al. | |
| 7,380,092 B2 | 5/2008 | Perego et al. | |
| 7,487,327 B1 | 2/2009 | Chang et al. | |
| 7,624,222 B2 * | 11/2009 | Nanda et al. | 710/316 |
| 7,752,413 B2 | 7/2010 | Hoover et al. | |
| 2002/0156943 A1 | 10/2002 | Ishimura et al. | |
| 2003/0131164 A1 | 7/2003 | Abramson et al. | |
| 2006/0059289 A1 | 3/2006 | Ng et al. | |
| 2008/0282102 A1 | 11/2008 | Reddy et al. | |
| 2010/0057974 A1 | 3/2010 | Reddy et al. | |
| 2010/0153618 A1 | 6/2010 | Mathieson et al. | |

OTHER PUBLICATIONS

Bluethgen. BEE Mux-Demux Implementation for Connecting Subsystems on 2 FPGAs. Jul. 15, 2002.*

(Continued)

*Primary Examiner* — Matthew Spittle

(57) ABSTRACT

In accordance with an aspect of the present invention, a corresponding list of muxes is maintained for each combination of a peripheral and a mux option. The list is then retrieved to program the required muxes to connect the communication paths from a peripheral on the corresponding mux option, based on which the list is retrieved. In an embodiment, the information is maintained in the form of a table, with each entry storing the data corresponding to a mux and mux option. The entries are linked by appropriate pointers to form the linked list.

20 Claims, 6 Drawing Sheets

OTHER PUBLICATIONS

Micro Computer Control. IP-201 I2C Bus Multiplexer Board. User's Guide. Revision 1. Jun. 2000.*

Erdahl. An Open Architecture for Multiplexing and Processing Telemetry Data. Veda Systems Incorporated. Jul. 15, 1997.*

Stok, L. Interconnect Optimisation During Data Path Allocation. IEEE. 1990.*

Digital Equipment Corporation. DH11 asynchronous 16-line multiplexer. Maintenance Manual. Apr. 1975.*

Campbell Scientific, Inc. AM16/32B Relay Multiplexer. Instruction Manual. Oct. 2009.*

Jiang et al. A Multiplexer Controlled by Fuzzy Associate Memory Leaky Bucket in ATM Networks. 1997 IEEE International Symposium on Circuits and Systems. IEEE. Jun. 12, 1997.*

Xilinx. Using Dedicated Multiplexers in Spartan-3 Generation FPGAs. Application Note. May 20, 2005.*

Non-Final Office Action Date Mailed Sep. 29, 2010; U.S. Appl. No. 12/275,217.

Interview Summary Date Mailed Sep. 30, 2010; U.S. Appl. No. 12/275,217.

Notice of Allowance Date Mailed Jan. 21, 2011; U.S. Appl. No. 12/275,217.

Notice of Allowance Date Mailed Jun. 9, 2011; U.S. Appl. No. 12/275,217.

* cited by examiner

|  | Primary | Alt 1 | Alt 2 | Alt 3 |
|---|---|---|---|---|
| Pin Out 0 | $P7_0$ | $P0_0$ | $P2_1$ | $P1_0$ |
| Pin Out 1 | $P1_1$ | $P0_1$ |  | $P7_0$ |
| Pin Out 2 | $P1_0$ | $P1_1$ | $P2_0$ | $P7_1$ |
| Pin Out 3 | $P7_1$ | $P1_0$ | $P2_2$ | $P1_1$ |

FIG. 2 (Prior Art)

| Index | Mux Identifier | Selection Index | Control Index | Next Index |
|---|---|---|---|---|
| X000000 | | | | |
| X000001 | X00 | X0000 | X000 | X100001 |
| X000010 | | | | |
| X000011 | | | | |
| X000100 | X10 | X0100 | X010 | X100010 |
| X000101 | X11 | X0110 | X011 | X100011 |
| X000110 | | | | |
| X000111 | X00 | X0000 | X000 | X100100 |
| X001000 | | | | |
| X001001 | | | | |
| X001010 | X10 | X0100 | X010 | X100101 |
| X001011 | | | | |
| X001100 | | | | |
| X001101 | | | | |
| X001110 | | | | |
| X001111 | | | | |
| X010000 | | | | |
| X010001 | | | | |
| X010010 | | | | |
| X010011 | | | | |
| X010100 | | | | |
| X010101 | | | | |
| X010110 | | | | |
| X010111 | | | | |
| X011000 | | | | |
| X011001 | | | | |
| X011010 | | | | |
| X011011 | | | | |
| X011100 | X00 | X0000 | X000 | X100111 |
| X011101 | | | | |
| X011110 | | | | |
| X011111 | X01 | X0010 | X001 | X101000 |
| X100000 | | | | |
| X100001 | X01 | X0010 | X001 | -1 |
| X100010 | X01 | X0010 | X001 | -1 |
| X100011 | X10 | X0100 | X010 | -1 |
| X100100 | X11 | X0110 | X011 | -1 |
| X100101 | X00 | X0000 | X000 | X100110 |
| X100110 | X11 | X0110 | X011 | -1 |
| X100111 | X11 | X0110 | X011 | -1 |
| X101000 | X10 | X0100 | X010 | -1 |

CONNECTING A PLURALITY OF PERIPHERALS

BACKGROUND

1. Field of Disclosure

The present invention relates to testing of integrated circuits and more specifically to optimal representation of connection information indicating the manner in which communication paths of peripherals can be connected to I/O pins during testing of an integrated circuit.

2. Related Art

An integrated circuit (IC) may contain several peripherals, with each peripheral representing a logic block with defined inputs and corresponding outputs. In general, design of a complex IC typically entails dividing the overall design into several logical blocks, with each logical block being referred to as a peripheral.

ICs are typically tested/validated after fabrication. Such testing generally entails providing pre-specified inputs to each peripheral and examining the output signals on specific input/output (I/O) pins. In general, each peripheral is provided communication paths, which provide a conductive path to the respective I/O pins.

It is generally desirable to minimize the number of I/O pins for reasons such as to limit the die size area, reduce cost, etc. Accordingly, a multiplexor/demux (referred to as a mux) is employed associated with each I/O pin, with the multiplexor being operable to connect a desired communication path to the I/O.

Thus, during testing of an IC, a tester generally chooses a desired set of peripherals that are required for a specific test, and causes the muxes to be programmed such that the communication paths of the set of peripherals are connected to the respective I/O pins.

As tests for different purposes are conducted sequentially, it is generally required that different sets of peripherals are used and muxes be programmed to connect different communication paths (of corresponding peripherals) to different I/O pins. Further, for enhanced speed/efficiency, it is generally desirable that such connections be effected programmatically (as opposed to manual determination of which communication path is to be connected to which I/O pin).

Integral to such programmatic configuration is representation of connection information indicating the manner in which communication paths of different peripherals can be connected to different I/O pins during testing of an integrated circuit. The representation may need to be optimal in the sense that a desired balance of various criteria such as speed and resource usage (e.g., memory requirement, processing requirements).

BRIEF DESCRIPTION OF THE DRAWINGS

The present invention will be described with reference to the following accompanying drawings, which are described briefly below.

FIG. 2 is a table summarizing the connection information.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

In accordance with an aspect of the present invention, a corresponding list of muxes is maintained for each combination of a peripheral and a mux option. A processor may receive a peripheral identifier and a mux option on which to connect the communication paths of the peripheral, and determine the muxes to be programmed based on the information maintained. The select values for each of the list of muxes is then set to the received mux option to connect the communication paths with the respective I/O pins.

Due to the maintenance of the list, the muxes that are to be programmed, may be quickly identified.

In an embodiment, the information is maintained in the form of a table, with each entry storing the data corresponding to a mux and mux option. The entries are linked by appropriate pointers to form the linked list. Each entry may further contain additional information to quickly identify the specific bits of registers which provide the select values for the muxes.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Integrated Circuit

Figure 1:
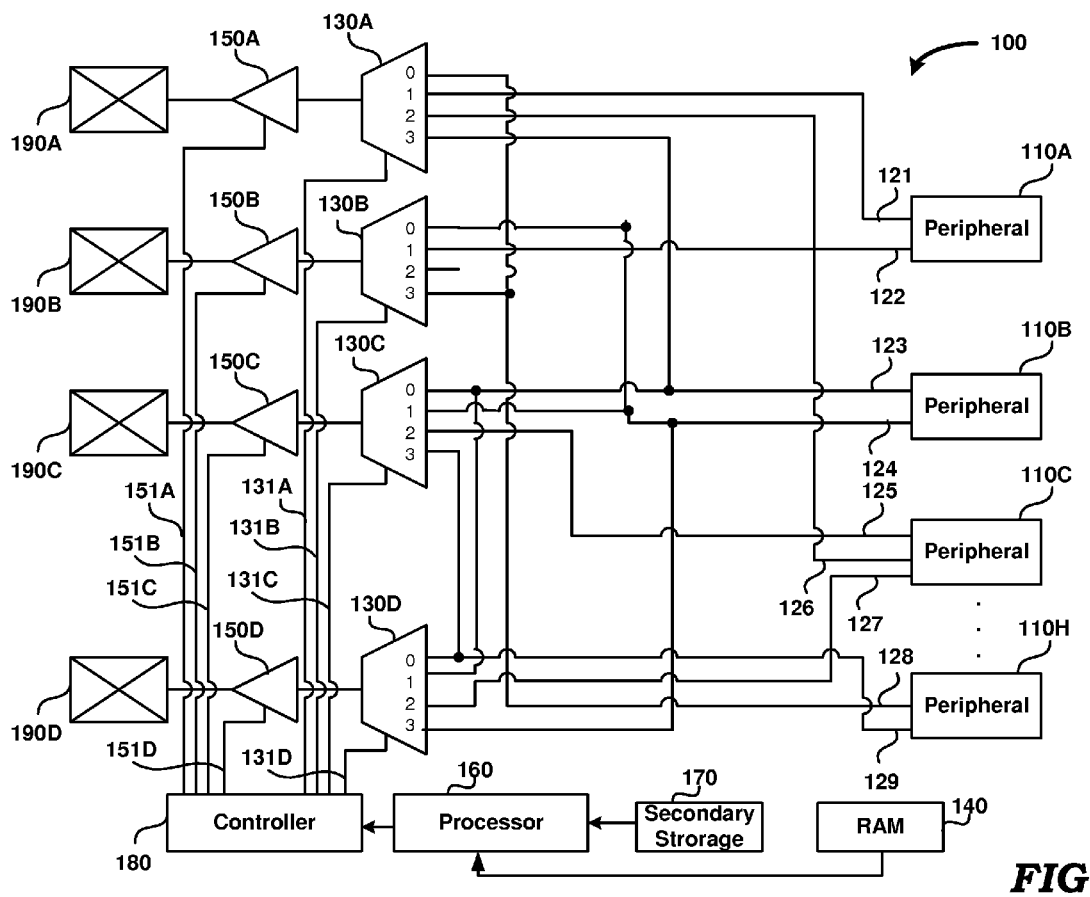
FIG. 1 is a circuit diagram illustrating the details of an example integrated circuit in which several aspects of the present invention can be implemented.

FIG. 1 is a circuit diagram illustrating the details of an example integrated circuit (IC) in which several aspects of the present invention can be implemented. Merely for conciseness a small number of components are shown. Most integrated circuits would have many more components, but of more/fewer types. In particular, it may be appreciated that the number of peripherals (and hence the peripheral pins/communication paths) is generally more compared to the number of I/O pins.

IC 100 is shown containing peripherals 110A-110H, muxes 130A-130D, random access memory (RAM) 140, tri-state buffers 150A-150D, processor 160, secondary storage 170, controller 180, and I/O pins 190A-190D. Peripherals 110A-110H are the logical blocks noted above. Each peripheral is designed to process a set of inputs and provide a set of outputs in providing a desired functionality. Though not shown, a peripheral can receive inputs from other peripherals and thus the output of one peripheral can be an input to other peripherals.

As pertinent to the present invention, each peripheral is shown with associated communication paths. Thus, the sets of paths 121-122, 123-124, 125-127 and 128-129 are shown associated with 110A, 110B, 110C and 110H respectively. Each communication path may be connected from a corresponding peripheral pin (with associated buffer, both pin and buffer are not shown). Each path may be designed to operate as an input path, output path, or both.

Each mux 130A-130D operates to connect one of the input paths with the corresponding I/O pin 190A-190D via the corresponding tri-state buffer 150A-150D under the control of corresponding select value 131A-131D. The connection is bi-directional.

Each multiplexor is shown with four inputs, respectively referred to as primary (labeled 0), alt 1 (labeled 1), alt 2 and alt 3 (together referred to as mux options). As an illustration, multiplexor 130A is shown receiving communication paths 128, 121, 126 and 123 on respective mux options.

It may be readily noted that some of the communication paths are connected to multiple muxes. For example, communication path 123 is connected to primary of mux 130C and alt 3 of mux 130A and alt 1 of mux 130D. In the illustrative example, the same communication path is not connected to the same mux option of different muxes. Further, for a given mux option for a given peripheral, either all the communication paths are provided on that mux option (on different muxes) or none provided, in the described illustrative embodiment(s).

Tri-state buffers 150A-150D provide a open path between the respective mux and I/O pin when the buffer is tri-stated, and a conductive path otherwise. The state of each tri-state buffer depends on the respective control value 151A-151D.

Controller 180 provides the various select values 131A-131D and control values 151A-151D. In an embodiment, controller 180 contains several registers, each having several bits at corresponding bit positions. Each of the select values and control values is hard-wired to specific bits at corresponding positions. Accordingly, processor 160 writes the appropriate values to each of the registers, as described below.

Processor 160 receives inputs indicating a peripheral identifier (e.g., P0-P7 respectively for 110A-110H) and a mux option. Processor 160 causes controller 180 to send appropriate select values 131A-131D and control values 151A-151D to connect the communication paths of the specified peripheral on the requested mux option.

The controller may need to disconnect connections provided for any previous tests as well and accordingly processor 160 may need to provide the appropriate values to controller 180. Either to connect or disconnect, processor 160 may need to optimally represent the connection information. Various aspects of the present invention provide for such optimal representation of the connection information.

In an embodiment, secondary storage 170 stores various data/instruction, which upon execution by processor 160 enables a user to control connection of various desired paths to the respective I/O pins according to a desired mux option. The instructions are generally retrieved from secondary storage 170, stored in RAM 140 and executed by processor 160 to provide various features of the present invention (including receiving user inputs as to desired mux option and peripheral and storing the appropriate values in the registers of controller 180, assuming the registers provide the control/select values).

In general, the mediums such as RAM (volatile memory) and secondary storage 170 (non-volatile memory), including hard drives, removable media drives, chemical storage, biological storage (including DNA strands) or other forms of medium, from which processor 160 can read instructions, are termed as computer or machine readable medium. Processor 160 reads such instructions from the computer/machine readable medium and executes the instructions to provide several features of the present invention, as described below.

The features of the present invention will be clearer in comparison with prior approaches and accordingly some prior approaches are described next below.

3. Prior Approach

FIG. 2 is a table illustrating the manner in which connection information of FIG. 1 is represented in a prior embodiment. The table is stored in a page generated using various Spreadsheet programs such Excel from Microsoft. As may be readily observed, the columns represent the various mux options and a row is provided for each I/O pin. For conciseness, all the tables/examples are described below as having only four peripherals 110A, 110B, 110C and 110H.

Each entry of the table thus indicates is either a blank (in which case the corresponding mux input is not connected to any communication path, for example, I/O pin 190B/mux 130B having no communication path on primary) or a value Pnm, wherein n and m are integers, with Pm representing the specific peripheral (P0-P7 respectively representing 110A, 110B, 110C, and 110H) and the value of m representing the path number on the peripheral. Thus, P21 implies communication path 126 of FIG. 1.

In one prior approach, the information of FIG. 2 is manually examined to determine the specific select values 131A-131D and control values 151A-151D to be used for a given test, and provides the corresponding commands to processor 160. Each command would thus specify the select value for each desired mux and a control value for the corresponding tri-state buffer.

Such manual approaches may be error prone and tedious and thus program based approaches may be employed to configure the muxes and tri-state buffers. It should be appreciated that the information of FIG. 2 can be stored in various ways in a memory, with corresponding memory requirements and performance metrics. An aspect of the present invention stores/represents the connection information in an optimal way as described below with examples.

4. Optimal Representation of Connection Information

Figure 3:
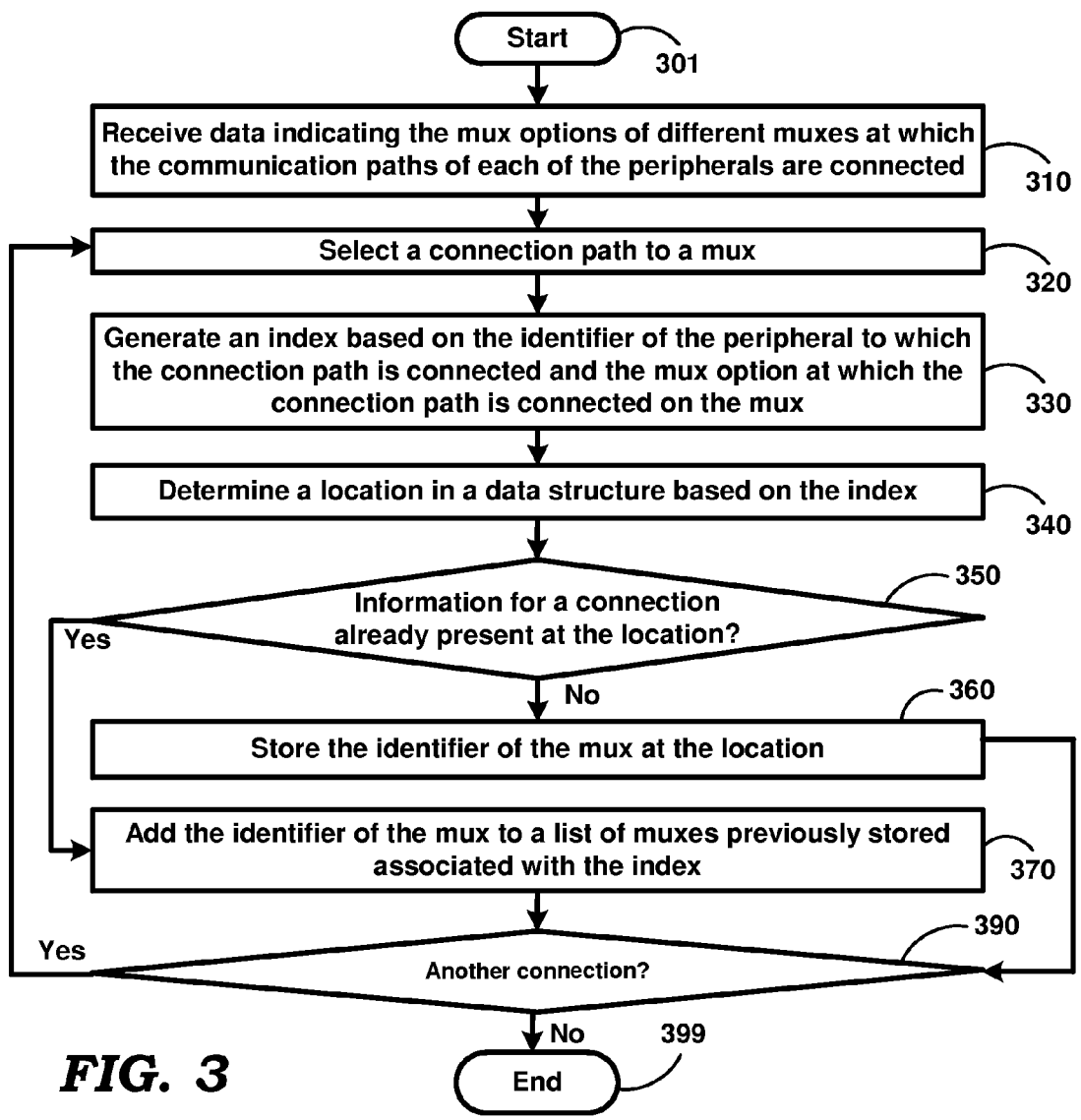
FIG. 3 is a flow chart illustrating the manner in which connection information is stored in a memory in an embodiment of the present invention.

FIG. 3 is a flow chart illustrating the manner in which the connection information described above can be stored according to an aspect of the present invention. The flow chart is described with respect to FIGS. 1 and 2 for illustration. However, the features can be implemented in various other scenarios, as will be apparent to one skilled in the relevant arts by reading the disclosure provided herein.

In addition, some of the steps may be performed in a different sequence than that depicted below, as suited in the specific environment, as will be apparent to one skilled in the relevant arts. Many of such implementations are contemplated to be covered by several aspects of the present invention. The flow chart begins in step 301, in which control immediately passes to step 310.

In step 310, processor 160 receives data indicating the mux options of different muxes at which the communication paths of each of the peripherals are connected. For example, the Spreadsheet page of FIG. 2 may be received.

In step 320, processor 160 selects a connection path to a mux. Any of the connection paths may be selected from the received data, though a pre-specified order of selection may ensure that all the connection paths would be processed iteratively.

In step 330, processor 160 generates an index based on the identifier of the peripheral to which the connection path is connected and the mux option at which the connection path is connected on the mux. In an embodiment, the index is generated according to the below equation:

Index=(periphealIdentifier*optionCount)+muxOption  Equation (1)

wherein * and + respectively represent the multiplication and addition operation, peripheralIdentifier is a unique one of a sequence of numbers (e.g., 0-7 for the eight peripherals) and muxOption is the mux option at which the presently processed connection path is connected. In an embodiment, each peripheral is identified by a peripheral type and an instance number of the type, and the peripheral identifier may be uniquely constructed based on the type identifier and instance identifier.

In step 340, processor 160 determines a location in a data structure based on the index. While various approaches can be used in computation of the index, the choice of data structure, and selection of the location within the chosen data structure, in the illustrative examples, the index represents a hash, which specifies the position of the location in a table.

In step 350, processor 160 determines whether information for a connection is already present at the location. Control passes to step 360 if there is no such information and to step 370 otherwise.

In step 360, processor 160 stores the identifier of the mux at the location and control passes to step 390. When the information is thus stored in step 360, the identifier represents a first element in a list.

Figure 4:
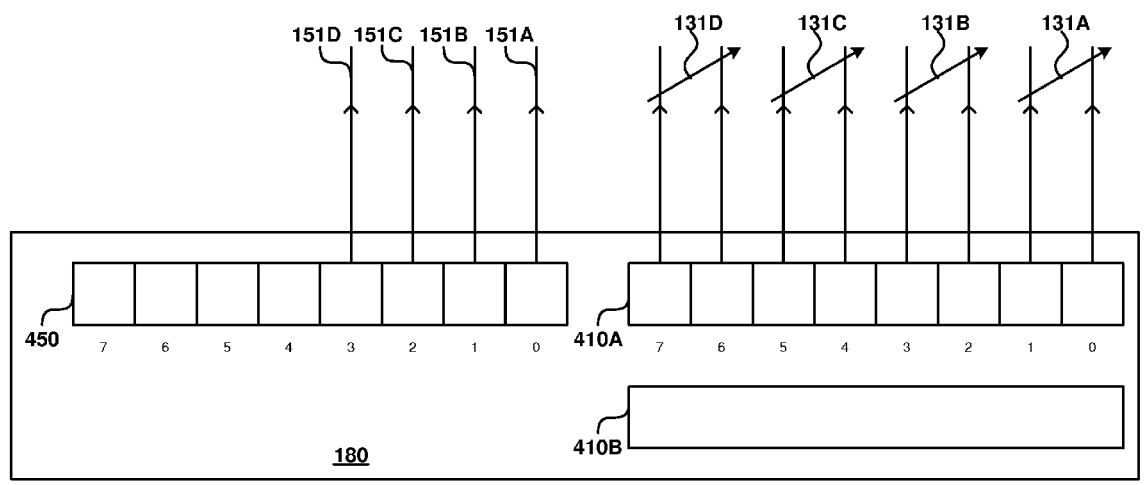
FIG. 4 is a block diagram illustrating the details of a controller in one embodiment.

In step 370, processor 160 adds the identifier of the mux to a list of muxes previously stored associated with the index. Thus, the identifier is added as the last element of the list (as a tail/end element in the case of a linked list, in the example illustration below). Various sub-data structures may be chosen to store the list, though the example of FIG. 4 is shown using a linked list. In general, storing as a list requires a specific convention and/or additional data, which indicates the association of the elements of the list, but not others.

In step 390, processor 160 determines whether at least one more connection is there to be processed. If there is such a connection, the next connection is processed in the next iteration by steps 320 onwards. If processing of all connection is complete, control passes to step 399, in which the flowchart ends.

In addition to storing the mux identifiers in the list, it may be desirable to store additional information that would help establish the desired connections. Such desirable information would include that information necessitated by the specific choice of implementation of controller 180 and accordingly the description is continued with respect to the details of a controller in one embodiment.

5. Controller Architecture

In an embodiment, controller 180 contains multiple registers, with the values at specific bit positions (0 through 7) providing the control/select values noted above. For simplicity, it is assumed that each register has eight bits and two successive bits are used to control each of the muxes 130A-130D, as depicted in FIG. 4. Thus, for example, bit positions 0 and 1 of register 410A are shown providing select value 131A.

Similarly, assuming only a single bit value is required to specify whether a tri-state buffer is to be in open or closed state, bit position 0-3 of register 450 are shown providing the control values 151A-151D.

Registers with more bits and more registers can be used to scale to more multiplexors, etc., as will be apparent to one skilled in the relevant arts by reading the disclosure provided herein. Thus, register 410B is shown as an additional register, which would accommodate four additional multiplexors (not shown).

The information stored in RAM 140 corresponding to such registers is described below.

6. Stored Information

Figure 5:
FIG. 5 is a table illustrating the manner in which connection information is represented in a memory in an embodiment.

FIG. 5 is a table illustrating example information stored by processor 160 (corresponding to the circuit configuration of FIG. 1) by execution of instructions stored in secondary storage 170 in one embodiment. The table is assumed to be stored in RAM 140. The data structure represents a linked list supported by a table, as described below.

Table 500 is shown containing an entry for each combination of desired peripheral and a desired mux option. Each entry (row in a table data structure) is shown with an index constructed with the peripheral identifier in the more significant 3 bits and the option number in the least 2 bits.

Thus, when a desired peripheral does not have any communication paths on a specific mux option, the corresponding entries are shown blank. For example, peripheral 110A (having an identifier of 000) has communication paths only on option 1 (identified as 01) and thus an entry is present at index 00001. On the other hand, no information is shown in entries with index values 00000 (peripheral 110A in option 0), 00010 (option 2) and 00011 (option 3).

On the other hand, when a peripheral has communication paths on a specific option, the list contains multiple entries, with each entry corresponding to a mux/communication path. The number of entries in a list thus equals the number of communication paths of the corresponding peripheral, as demonstrated with respect to peripheral 110B (identifier 001).

To appreciate the linked list, it may be observed first from FIG. 1 that peripheral 110B has 2 communication paths, each provided on option 0, 1 and 3. The first communication path 123 is shown connected to options 0, 1 and 3 respectively at muxes 130C, 130D and 130A. The second communication path 124 is shown connected to options 0, 1, and 3 (same mux options) at muxes 130B, 130C and 130D.

The organization of the information in table 500 indicates the specific muxes (equals the number of communication paths for that peripheral) that receive the communication paths for a given peripheral (for that specific option). Accordingly, a linked list of 2 entries (corresponding to number of communication paths) is created for the combination of peripheral 110B and a mux option.

Thus, there are shown three lists for peripheral 110B (identifier 001) for the three options 0, 1 and 3 (identified by 00, 01 and 11) starting at entries 00100, 00101 and 00111, and each list contains two entries. For example, for option 01, the entry at index 000101 points to (in the 'Next Index' column) x100011. The information at indexes x000101 and x100011 respectively correspond to the two muxes 130C and 130D for the communication paths 123 and 124 respectively.

It may be observed that there would be several unused entries (in the hashed area of x00000 to x011111) corresponding to the combinations of peripherals when the communication paths are not provided on corresponding mux options.

However, when more than one communication path is present for a given peripheral, the additional required entries are accommodated in overflow area (shown with indexes x100000 onwards), with each entry in the overflow area potentially being used sequentially as step 370 of FIG. 3 is performed in iterations.

Each entry is shown containing mux identifier as well. While the mux identifier and the desired mux option (later during testing) may identify the manner in which each of the registers of FIG. 4 is to be configured, the information in columns Selection Index and Control Index may be used to specify the bit positions and the specific register that is to be configured.

Selection index is shown containing 4 bits each. The most significant bit indicates one of the two registers 410A/410B that controls the corresponding mux, and the remaining 3 bits indicate the start bit position of the group of bits (2 bits each, as described above with respect to FIG. 3) of that register, which provides the selection value for the corresponding mux. Thus, for all entries with mux 130A (identifier x00), a value of 000 is shown indicating that the 2 bits start from bit position 0. Similarly, values of 010, 100, and 110 are respectively shown associated with each occurrence of muxes 130B, 130C and 130D.

Control index similarly specifies the register and the bit position, which provide the corresponding control value to each of the muxes. Thus, a value of 0x000, 0x001, 0x010, and 0x011 are shown associated with muxes 130A-130D respectively.

It should be appreciated that the hash approach described above can be extended to make the table more compact (if the number of unused entries is unacceptably high). In such a case, more entries may map to the same location, but the presence of mux identifier can then be used to select only those entries that correspond to the mux identifier presently being processed.

Once the information is thus populated in table 500, processor 160 may then efficiently process requests to connect (or disconnect) a specific peripheral on a specified/desired mux option, as described below in further detail.

7. Using Stored Information

Figure 6:
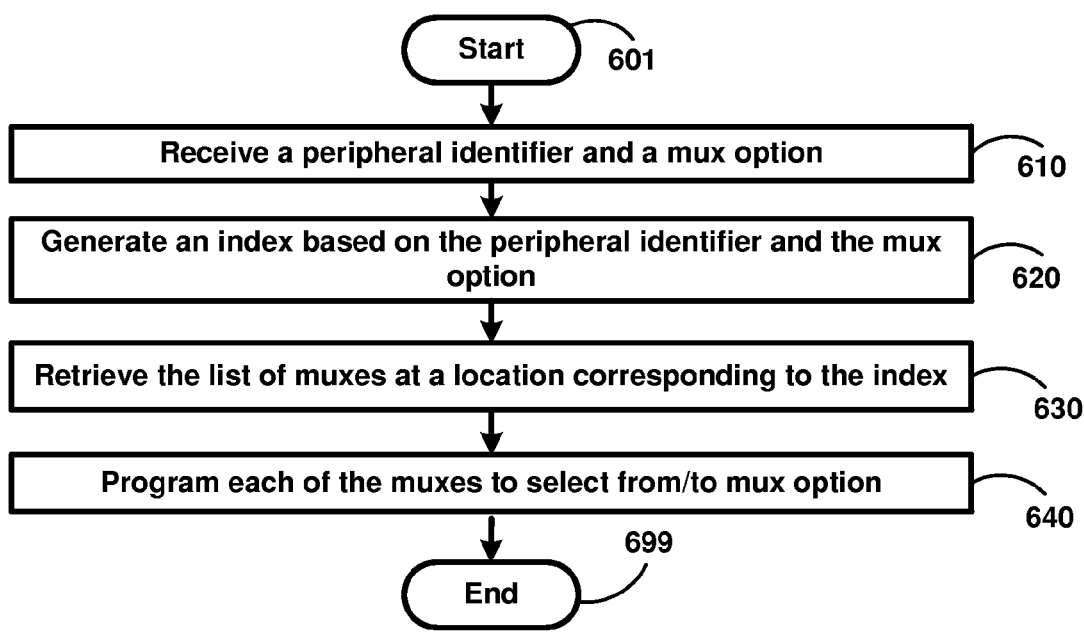
FIG. 6 is a flow chart illustrating the manner in which the connection information is used in connecting and disconnecting communication paths from respective I/O pins according to an aspect of the present invention.

FIG. 6 is a flowchart illustrating the manner in which the connection information described above can be used according to an aspect of the present invention. The flow chart is described with respect to FIGS. 1, 4 and 5 for illustration. However, the features can be implemented in various other scenarios, as will be apparent to one skilled in the relevant arts by reading the disclosure provided herein.

In addition, some of the steps may be performed in a different sequence than that depicted below, as suited in the specific environment, as will be apparent to one skilled in the relevant arts. Many of such implementations are contemplated to be covered by several aspects of the present invention. The flow chart begins in step 601, in which control immediately passes to step 610.

In step 610, processor 160 receives a peripheral identifier and a mux option. The combination may be received either to connect the paths on the mux option or to disconnect the communication paths previous connected. The combination can be generated programmatically or directly based on a user input specifying the combination.

In step 620, processor 160 generates an index based on the peripheral identifier and the mux option. The same formula used in step 330 of FIG. 3 may be used to generate the index.

In step 630, processor 160 retrieves the list of muxes at a location corresponding to the index. Assuming the table of FIG. 5 is stored in RAM 140, processor 160 may retrieve the specific rows of table 500 corresponding to the list. For illustration, assuming that a user has specified peripheral 110B and mux option 01 (alt 1), rows corresponding to index 0x000101 and the (via the next instep) corresponding to index x100011 may be retrieved. The list of muxes are together identified by the mux identifier in each of the retrieved rows.

In step 640, processor 160 programs each of the muxes to select from/to the specified mux option. With respect to the information shown in FIG. 5, selection index is used to determine the specific register and the bit positions in the register. Processor 160 then stores the mux option at the determined registers and bit positions. Similarly, the control index is also used to store the bit value corresponding to close (in case of connect) or open (in case of disconnect) at the appropriate register and bit position.

Thus, in processing the entry corresponding to the row at 0x000101, select index indicates a value of 0x0110 (6 in decimal) and accordingly the mux option of 01 is stored in bits 7 and 6 of register 410A. A value of 01 would cause mux 130D to select alt 1 (communication path 123). Similarly, a value of 01 would be stored at bit positions 5 and 4 of register 410A by processing the row at index 0x100011, which would cause mux 130C to select communication path 124, as desired.

Thus, the information organized as above can be used to efficiently connect and disconnect the communication paths to I/O pins.

8. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method of connecting a plurality of peripherals, said method comprising:
receiving data identifying communication paths associated with each of said plurality of peripherals;
selecting a first connection path to a first multiplexor between a first peripheral and a first node of said first multiplexor;
generating an index based on an identifier of said first peripheral and said first node;
determining a location in a memory based on said index and determining whether connection information is stored at said location;
storing an identifier of said first multiplexor at said location if connection information is not stored at said location; and
adding said identifier of said first multiplexor to a list of multiplexors if connection information is stored at said location.

2. The method of claim 1, wherein said connecting is performed with each communication path being treated as said first connection path.

3. The method of claim 2, wherein said list of multiplexors is maintained as a linked list wherein said identifier is stored as a last element of said linked list.

4. The method of claim 3, wherein said location in memory comprises a data structure that comprises a table.

5. The method of claim 2, further comprising:
receiving a second peripheral identifier and a second node option;
generating a second index based on said second peripheral identifier and said second node option;
retrieving a list of multiplexors corresponding to said second index; and
programming each of the multiplexors in said list to select said second node option.

6. The method of claim 5, wherein said programming comprises storing said second node option at a plurality of register bits that correspond to said multiplexors.

7. The method of claim 6, wherein said programming uses stored register position values in storing said second node option.

8. The method of claim 6, wherein said programming further comprises storing a value which would cause said tri-state buffers corresponding to said list of multiplexors to be closed.

9. An article of manufacture comprising a machine-readable medium having executable instructions, wherein execution of said instructions causes a processor to perform actions comprising:
receiving data identifying communication paths associated with each of a plurality of peripherals;
selecting a first connection path to a first multiplexor between a first peripheral and a first node of said first multiplexor;
generating an index based on an identifier of said first peripheral and said first node;
determining a location in a memory based on said index and determining whether connection information is stored at said location;
storing an identifier of said first multiplexor at said location if connection information is not stored at said location; and
adding said identifier of said first multiplexor to a list of multiplexors if connection information is stored at said location.

10. The article of manufacture of claim 9, wherein connecting is performed with each communication path being treated as said first connection path.

11. The article of manufacture of claim 10, wherein said list of multiplexors is maintained as a linked list wherein said identifier is stored as a last element of said linked list.

12. The article of manufacture of claim 11, wherein said location in memory comprises a data structure that comprises a table.

13. The article of manufacture of claim 10, further comprising:
receiving a second peripheral identifier and a second node option;
generating a second index based on said second peripheral identifier and said second node option;
retrieving a list of multiplexors corresponding to said second index; and
programming each of the multiplexors in said list to select said second node option.

14. The article of manufacture of claim 13, wherein said programming comprises storing said second node option at a plurality of register bits that correspond to said multiplexors.

15. The article of manufacture of claim 14, wherein said programming uses stored register position values in storing said second node option.

16. The article of manufacture of claim 14, wherein said programming further comprises storing a value which would cause said tri-state buffers corresponding to said list of multiplexors to be closed.

17. A method comprising:
receiving data identifying communication paths associated with each of a plurality of peripherals;
selecting a first connection path to a first multiplexor between a first peripheral and a first node of said first multiplexor;
generating an index based on an identifier of said first peripheral and said first node;
determining a location in a memory based on said index and determining whether connection information is stored at said location;
storing an identifier of said first multiplexor at said location when connection information is not stored at said location; and
adding said identifier of said first multiplexor to a list of multiplexors when connection information is stored at said location.

18. The method of claim 17, wherein connecting is performed with each communication path being treated as said first connection path.

19. The method of claim 18, wherein said list of multiplexors is maintained as a linked list.

20. The method of claim 17, wherein said location in memory comprises a data structure.

* * * * *